(12) United States Patent
Massmann et al.

(10) Patent No.: US 7,266,138 B2
(45) Date of Patent: Sep. 4, 2007

(54) PUMP ARRANGEMENT FOR TRANSVERSALLY PUMPING AN ACTIVE MEDIUM

(75) Inventors: Frank Massmann, Berlin (DE); Heike Voss, Berlin (DE)

(73) Assignee: IBL Industrial Broad-Spectrum Laser AG, Berlin (DE)

( * ) Notice: Subject to any disclaimer, the term of this patent is extended or adjusted under 35 U.S.C. 154(b) by 269 days.

(21) Appl. No.: 10/499,311

(22) PCT Filed: Dec. 17, 2002

(86) PCT No.: PCT/DE02/04719

§ 371 (c)(1),
(2), (4) Date: Feb. 17, 2005

(87) PCT Pub. No.: WO03/052889

PCT Pub. Date: Jun. 26, 2003

(65) Prior Publication Data

US 2005/0129080 A1    Jun. 16, 2005

(30) Foreign Application Priority Data

Dec. 18, 2001  (DE) ................ 101 64 523

(51) Int. Cl.
*H01S 3/14*    (2006.01)
*H01S 3/09*    (2006.01)
(52) U.S. Cl. .......................... 372/69; 372/39
(58) Field of Classification Search .......... 372/39, 372/54, 66, 69, 75, 83

See application file for complete search history.

(56) References Cited

U.S. PATENT DOCUMENTS

| 5,307,365 A | 4/1994 | Stappaerts et al. |
| 5,661,738 A | 8/1997 | Yasui et al. |
| 5,774,488 A | 6/1998 | Kmetec |
| 5,781,580 A | 7/1998 | Winik |
| 6,704,341 B1 * | 3/2004 | Chang .......................... 372/70 |

FOREIGN PATENT DOCUMENTS

| EP | 0 798 827 A2 | 10/1997 |
| EP | 1 128 505 A2 | 8/2001 |

OTHER PUBLICATIONS

Fujikawa, S. et al., "28% Electrical-efficiency Operation of a Diode-side-pumped Nd:YAG Rod Laser", Optics Letters, Optical Society of America, May 1, 2001, pp. 602-604, vol. 26, No. 9, Washington, US.

(Continued)

*Primary Examiner*—Armando Rodriguez
(74) *Attorney, Agent, or Firm*—The Webb Law Firm

(57) ABSTRACT

The invention relates to a pump arrangement for transversally pumping an active medium, especially a laser rod, wherein two pump light sources are arranged on a plane perpendicular to the longitudinal axis of the active medium, especially pertaining to the laser rod. The value of the smallest angle between the central axes of the pump light sources is less than 180°. A pump arrangement is also provided which illuminates the active medium in a particularly uniform manner.

11 Claims, 5 Drawing Sheets

OTHER PUBLICATIONS

Koechner, W., "High Energy Diode-pumped Solid State Lasers", The Review of Laser Engineering, Jul. 7, 1991, pp. 619-626, vol. 19, No. 7, Osaka, JP.

Jackson, S. D. et al., "Encapsulated Rod for Efficient Thermal Management in Diode-side-pumped Nd:YAG Lasers", Applied Optics, Optical Society of America, May 20, 1996, pp. 2562-2565, vol. 35, No. 15, Washington, US.

Eichler & Eichler, Laser Bauformen Strahlführung Anwendungen [*Types of Lasers, Beam Guidance, Application*], Springer, 3rd Edition, 1998, p. 150.

* cited by examiner

PUMP ARRANGEMENT FOR TRANSVERSALLY PUMPING AN ACTIVE MEDIUM

BACKGROUND OF THE INVENTION

1. Field of the Invention

This invention relates to a pump arrangement for the transversal pumping of an active medium.

2. Description of the Related Art

It is known that active medium of a laser with diode lasers can be pumped longitudinally or transversally (see, for example, Eichler, Eichler; Laser-Bauformen, Strahlführung, Anwendung [Types of Lasers, Beam Guidance, Application], Springer, 3rd Edition, Page 150). For the transversal pumping, a laser diode is located laterally with respect to the active material, so that the laser beam strikes the active medium from the side. As a result of this arrangement, however, it is not possible to illuminate the interior of the active medium uniformly.

SUMMARY OF THE INVENTION

An object of this invention is to create a pump arrangement for transversal pumping that illuminates the active medium uniformly.

The invention teaches that two pump light sources are located in a plane that is perpendicular to the longitudinal axis of the active medium, in particular a laser rod, whereby the size of the smallest angle between the center axes of the pump light sources is less than 180°. Therefore two pump light sources are used that are in all cases not exactly opposite each other, i.e. the pump light sources are oriented in a plane at an angle to each other. This transversal pump arrangement makes possible a uniform illumination of the active medium.

It is thereby advantageous if the angle between the center axes of the pump light sources in a plane is 120° or 90°.

An advantageous realization of the pump arrangement claimed by the invention has two groups of pump light sources in different planes, whereby the planes are oriented perpendicular to the longitudinal axis of the active medium, in particular of a laser rod. The pump light sources are therefore distributed parallel over the length of the active medium, which results in a particularly good illumination.

Each group of pump light sources advantageously has two pump light sources.

A particularly favorable illumination of the active medium can be achieved if the center axes of the pump light sources in a first plane are rotationally offset with respect to the center axes of the pump light sources of a second plane by an angle around the longitudinal axis of the active medium, in particular of the laser rod. The pump light sources are thus not only located along the active medium, but also strike the active medium from different directions.

It is particularly advantageous if the angle that describes the rotation of the center axes of the pump light sources with respect to the longitudinal axis of the laser rod is 180°.

In one advantageous configuration, at least one pump light source is realized in the form of a laser diode. It is also advantageous if a laser diode emits a linear laser beam.

In an additional advantageous configuration of the pump arrangement claimed by the invention, the pump light beam can be formed by at least one lens system, in particular a micro lens system for laser diode radiation.

It is particularly advantageous if the pump arrangement claimed by the invention has a water cooling system, in particular a flowtube system.

The flowtube advantageously has at least one reflective coating, in particular made of gold and/or silver.

It is also advantageous if the reflective coating is surrounded by at least one thermally conductive layer.

DESCRIPTION OF THE PREFERRED EMBODIMENTS

Figure 1:
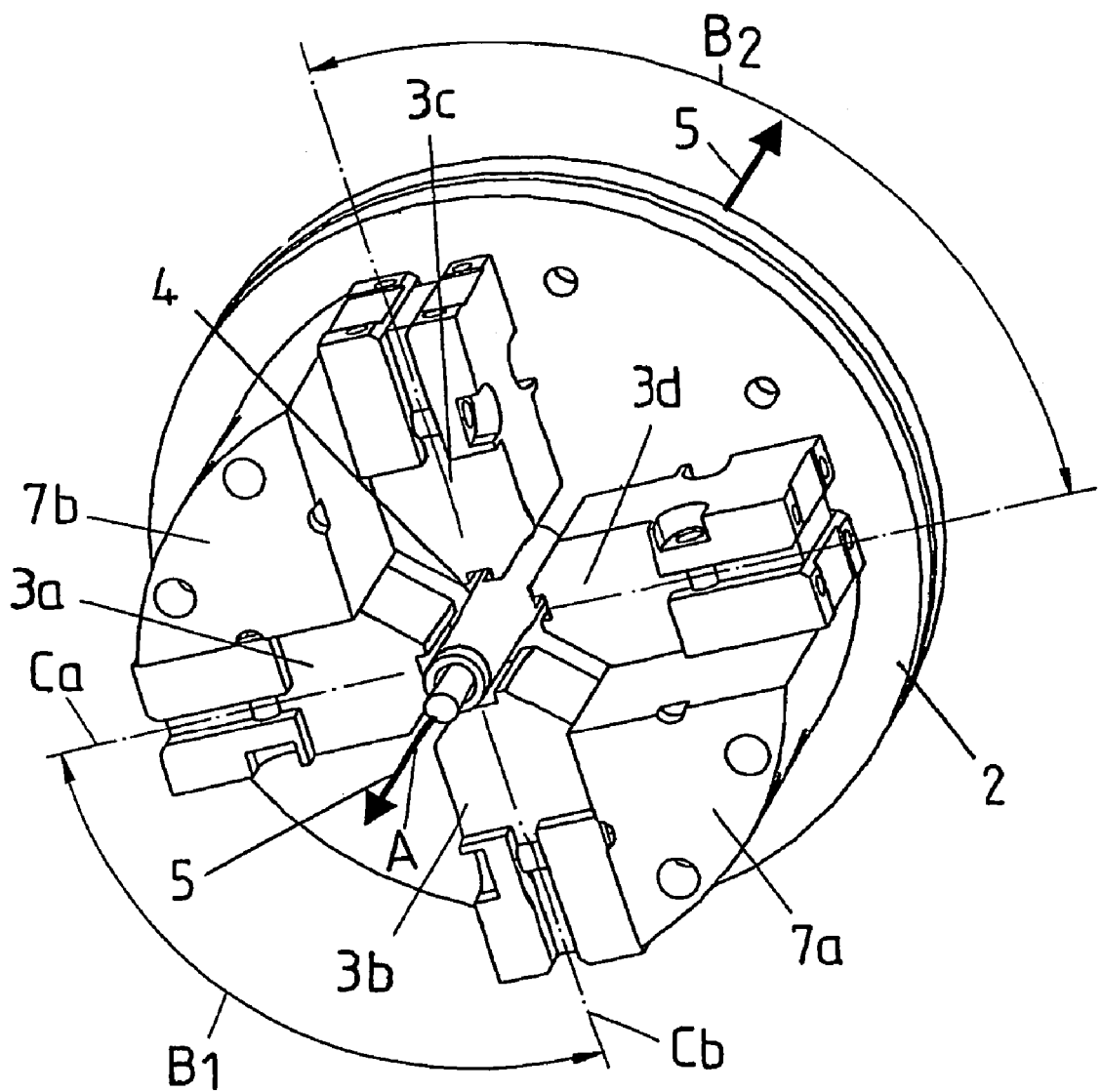
FIG. 1 is a perspective view of one embodiment of the pump arrangement according to the present invention.

FIG. 1 shows one embodiment of a pump arrangement which can be used as a pump chamber for a laser resonator or as an optical amplifier for a laser beam.

The pump arrangement has four pump light sources 3a, 3b, 3c, 3d which are realized in the form of edge-emitting laser diodes. The pump light sources 3a, 3b, 3c, 3d are arranged around a laser rod 5 as the active medium, so that the laser rod 5 can be pumped transversally. The radiation in the laser rod 5, i.e. between the resonator surfaces, is indicated by arrows in FIG. 1. The laser rod 5 has a longitudinal axis A.

The pump light sources 3a, 3b, 3c, 3d are thereby arranged in groups in two different planes 10, 20 (see in particular FIG. 2), whereby the planes 10, 20 are perpendicular to the longitudinal axis A of the laser rod 5.

The first group of pump light sources 3a, 3b lies in the first, front plane 10 in FIG. 1 and the second group of pump light sources 3c, 3d lies in the second, rear plane 20 in FIG. 1.

The pump light sources 3a, 3b, 3c, 3d are oriented in the respective planes 10, 20 at a right angle $B_1$, $B_2$ to each other. Basically, other angles B in a plane are also conceivable, as long as the pump light sources 3a, 3b, 3c, 3d in a plane 10, 20 are not diametrically opposite each other. If they were diametrically opposite each other, the angle would be exactly 180°. The invention teaches that the angle B is therefore less than 180°.

Figure 2:
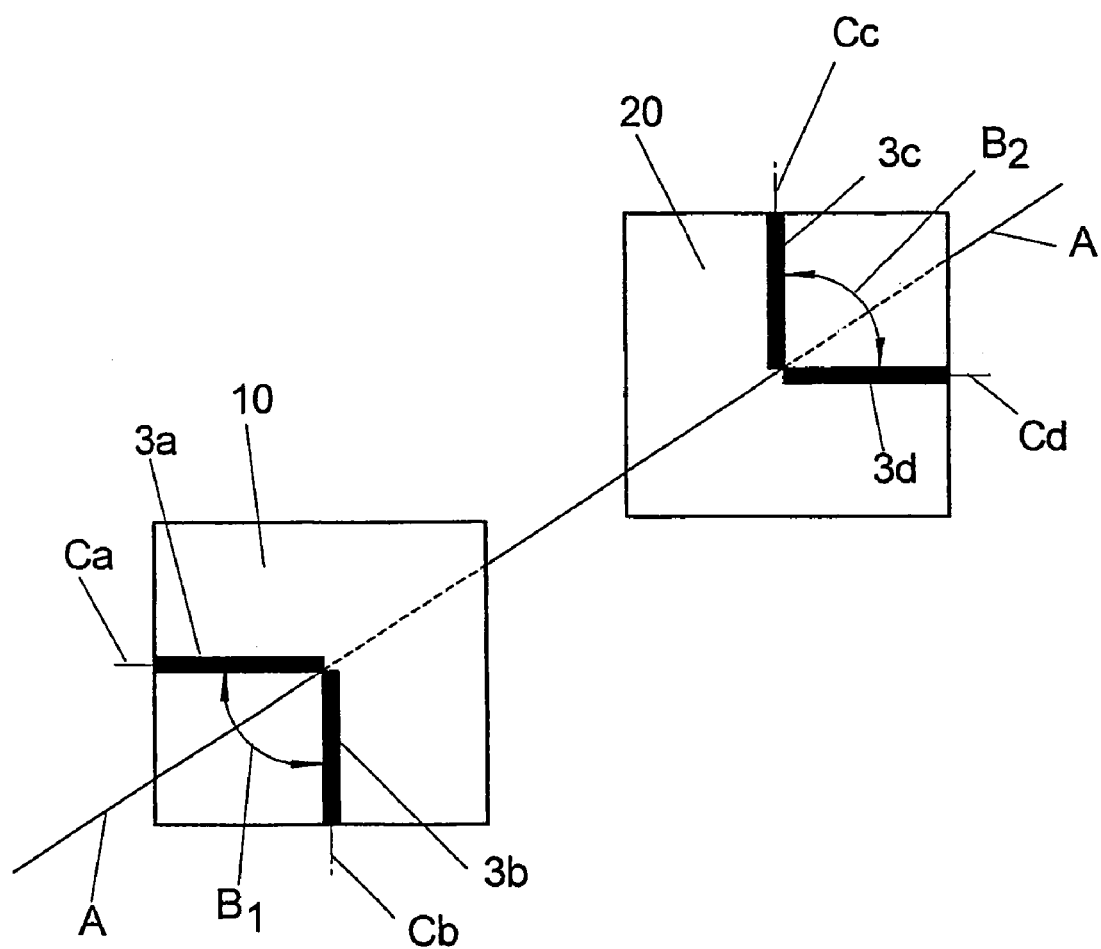
FIG. 2 is a schematic view of the arrangement of the pump light sources.

As is more clearly illustrated in FIG. 2, the pump light sources that are arranged in pairs are also rotated with respect to one another by a determined angle.

The pump light sources 3a, 3b, 3c, 3d, on the end that points toward the laser rod 5, a wedge-shaped realization (see also FIG. 4), so that the pump laser diodes can be placed as close as possible to the laser rod 5. In this case, the laser rod can have a diameter of up to 6 mm. The pump length of the laser rod 5 is twice the length of the pump light sources 3a, 3b, 3c, 3d, which in this case are identical pump light sources.

The pump light sources 3a, 3b, 3c, 3d and the laser rod 5 are located on a central piece 2 with spokes 7a, 7b (see FIG.

3). Located around the laser rod 5 is a flowtube 4 which acts as a cooling system and is explained in greater detail in connection with FIG. 5. In the central piece 2 there are channels for the cooling water supply to the pump light sources 3a, 3b, 3c, 3d and to the laser rod 5.

In the exemplary embodiment illustrated here, the pump light sources 3a, 3b, 3c, 3d are all constructed identically. Alternatively, different models of light sources can also be used.

FIG. 2 is a schematic illustration of the arrangement of the pump light sources 3a, 3b, 3c, 3d to show the geometric relationships. The illustration in FIG. 2 is a view in perspective, whereby in this case the pump light sources 3a, 3b, 3c, 3d are represented only by lines.

The planes 10, 20 are perpendicular to the longitudinal axis of the laser rod 5. The first plane 10 is thereby located in front of the second plane 20 in the direction of the view shown in the drawing. In the first plane, there are two pump light sources 3a, 3b that are at an angle $B_1=90°$ to each other. The invention teaches that this angle can be between (almost) 0° and less than 180°.

Two pump light sources 3c, 3d are located in the second plane at an angle of $B_{2=90}°$ to each other. The invention teaches that this angle can also be between (almost) 0° and less than 180°.

The pump light sources 3a, 3b in the first plane 10 each have center axes Ca, Cb. The pump light sources 3c, 3d in the second plane have respective center axes Cc, Cd.

The center axes Ca, Cb of the pump light sources 3a, 3b in the first plane 10 are rotated with respect to the center axes Cc, Cd of the pump light sources 3c, 3d in the second plane 20 by an angle of 180° around the longitudinal axis A of the laser rod 5.

With this arrangement, which is offset along the longitudinal axis A, it becomes possible to achieve a particularly uniform illumination of the laser rod 5.

Figure 3:
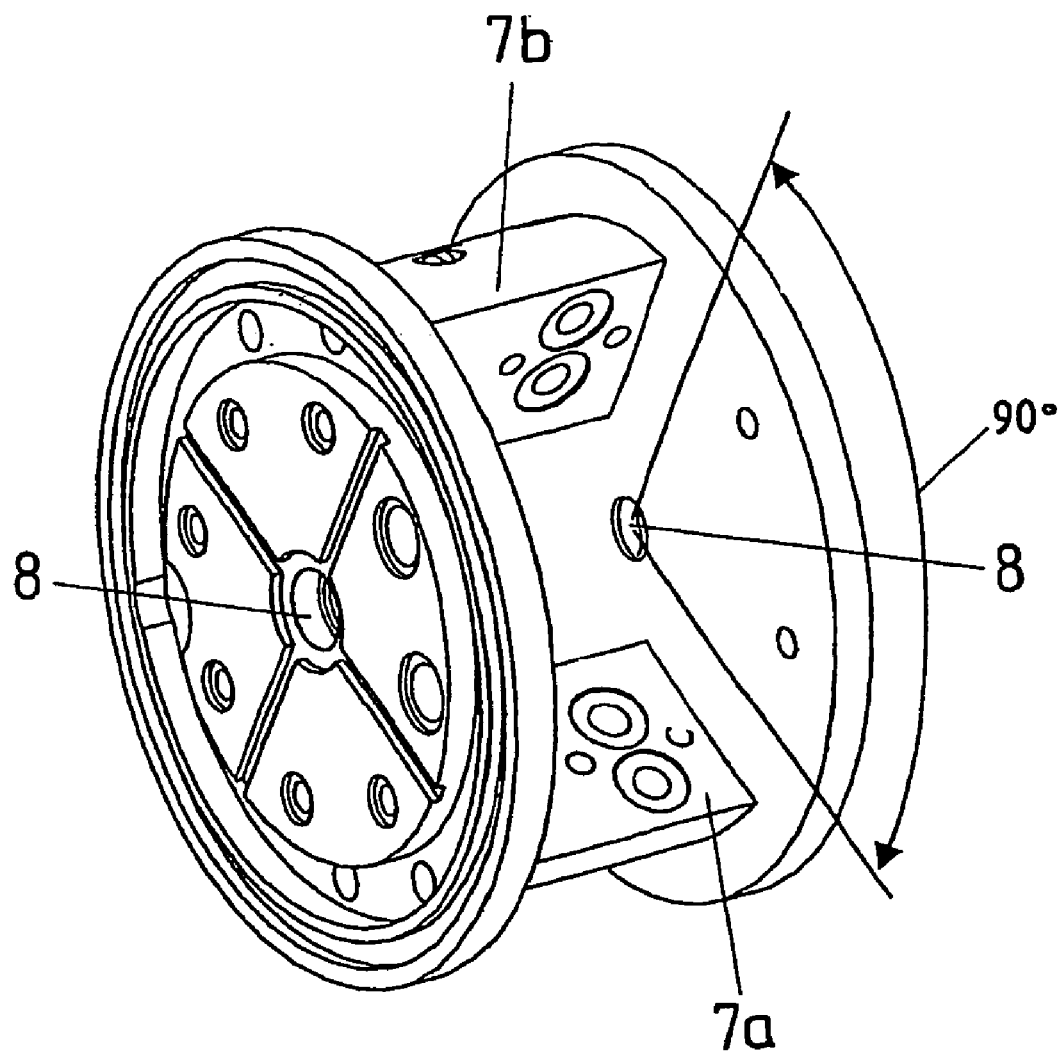
FIG. 3 is a perspective view of a central piece of one embodiment of the pump arrangement claimed by the invention.

In FIG. 3, the central piece 2 is shown in detail, although without the pump light sources 3a, 3b, 3c, 3d and without the laser rod 5. In the center, the openings are visible as the flow tube holders 8.

The central piece 2 has two spokes 7a, 7b which are used for the installation of the pump light sources 3a, 3b, 3c, 3d. The spokes are arranged at an angle of 90° from each other. In the spokes 7a, 7b are channels for the cooling water supply. To provide power to the laser diodes, contact is achieved by means of a laminated printed circuit board, which makes possible a simple installation of the diodes.

As shown in FIG. 1, two laser diodes are located on each of the spokes 7a, 7b in the form of pump light sources 3a, 3b, 3c, 3d.

Figure 4:
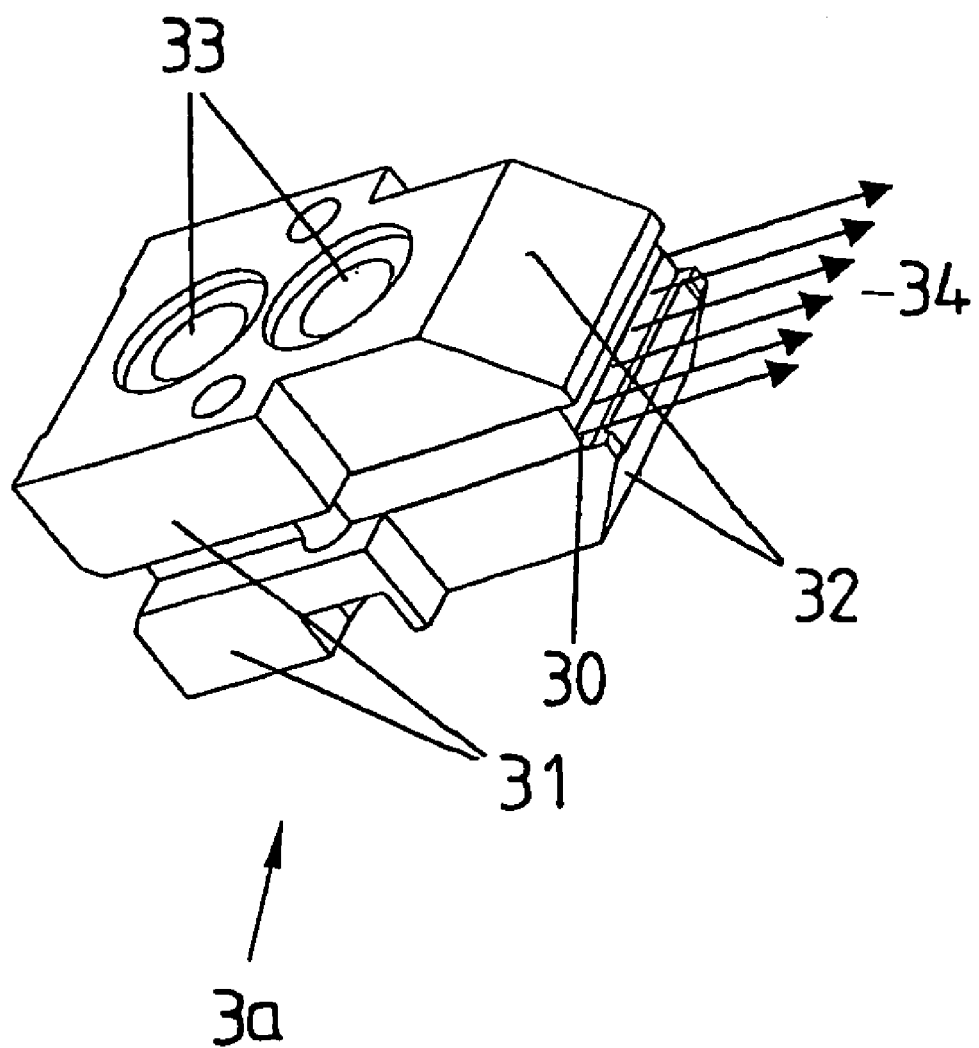
FIG. 4 is a perspective view of a laser diode as the pump light source.

FIG. 4 shows an individual pump light source 3a, which is realized for installation into the pump arrangement claimed by the invention. A diode laser array is located between two clamping jaws 31. The clamping jaws 31 are beveled by 45° on the side that faces the laser rod 5.

The angle of the bevel can alternatively be smaller than 45°. Connections (feed and drain) for the water supply are integrated into the clamping jaws 31. The diode laser beam 34 can be shaped by micro lenses that are not shown in the drawing. The wider part of the jaw is used for fastening to the spokes 7a, 7b (see FIGS. 1 and 3).

Figure 5:
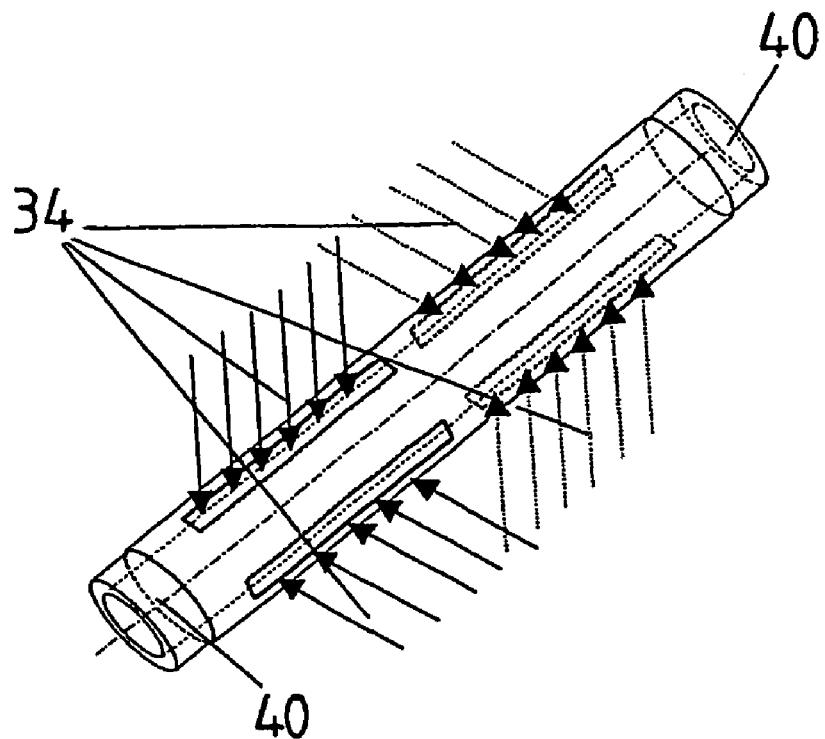
FIG. 5 is a perspective schematic view of a flowtube as the cooling system.

FIG. 5 is a schematic view in perspective of a flowtube 4 which is used as a cooling system for the laser rod 5 (not shown here).

The flowtube 4 is provided with various coatings (See FIG. 5a), which are removed in the areas in which the diode radiation 36 enters the laser rod 5 for transversal pumping.

The side opposite the pump beam can be provided with a reflective coating. The flowtube 4 has uncoated sealing surfaces 40 on the ends.

Figure 5A:
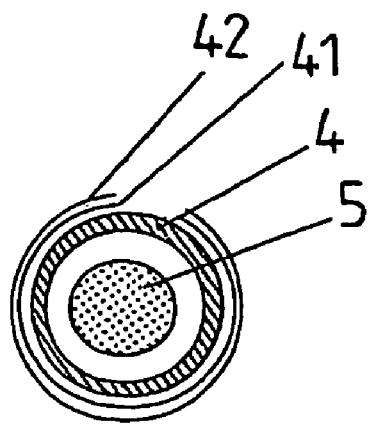
FIG. 5a is a sectional view of the flowtube illustrated in FIG. 5.

The flowtube 4 is shown in cross section in FIG. 5a. The laser rod 5 is located inside the flowtube. Said laser rod is surrounded by the actual flow tube 4. The flowtube 4 is provided on its outward-facing surface with a reflective coating 41. If this reflective coating 41 does not have sufficient thermal conductivity, it can be surrounded (as shown here) by a thermally conductive coating 42 (e.g. copper, nickel), so that the heat that results from residual absorption can be discharged via the cooling medium.

The realization of the invention is not limited to the preferred exemplary embodiments described above. On the contrary, there are a number of conceivable variants that make use of the pump arrangement claimed by the invention even in fundamentally different realizations.

NOMENCLATURE

1 Pump chamber
2 Central piece
3 Pump light source (laser diodes 3a, 3b, 3c, 3d)
4 Cooling system (flowtube)
5 Laser rod
6 End pieces
7a, 7b Spokes
8 Flow tube holder
10 First plane
20 Second plane
30 Diode laser array
31 Clamping jaws
32 Beveled edges
33 Water feed and drain
34 Diode beam
40 Sealing surfaces
41 Reflective coating
42 Thermally conductive coating
A Longitudinal axis of the laser rod
B Angle between two pump light sources in a plane
C Center axis of the pump light sources

The invention claimed is:

1. A pump arrangement for the transversal pumping of an active medium, such as a laser rod, comprising two pump light sources located in a plane perpendicular to the longitudinal axis of the active medium, whereby the size of the smallest angle between the center axes of the pump light sources is less than 180° and at least two groups of pump light sources are located in different planes, whereby the planes are oriented perpendicular to the longitudinal axis of the active medium, wherein each group of pump light sources (3a, 3b, 3c, 3d) has two of said pump light sources.

2. The pump arrangement as claimed in claim 1, wherein an angle (B) between the center axes (Ca, Cb) of said pump light sources (3a, 3b) is selected from the group consisting of 120° and 90°.

3. The pump arrangement as claimed in claim 1, wherein center axes (Ca, Cb) of said pump light sources (3a, 3b) in a first plane are rotated with respect to center axes (Cc, Cd) of said pump light sources (3c, 3d) in a second plane by an angle around longitudinal axis (A) of the active medium.

4. The pump arrangement as claimed in claim 3, wherein said angle that describes the rotation of center axes (Ca, Cb, Cc, Cd) of said pump light sources (3a, 3b, 3c, 3d) with respect to longitudinal axis (A) of the laser rod is 180°.

5. The pump arrangement as claimed in claim 1, wherein at least one of said pump light sources (3a, 3b, 3c, 3d) is a laser diode.

6. The pump arrangement as claimed in claim 4, wherein at least one of said pump light sources (3a, 3b, 3c, 3d) is a laser diode.

7. The pump arrangement as claimed in claim 5, wherein at least one laser diode (3a, 3b, 3c, 3d) emits linear laser radiation.

8. The pump arrangement as claimed in claim 6, wherein the pump light beam said pump light sources can be shaped by at least one lens system, such as a micro lens system for laser diode radiation.

9. The pump arrangement as claimed in claim 1, further comprising a water cooling system in the form of a flowtube system.

10. The pump arrangement as claimed in claim 9, wherein the flowtube has at least one reflective coating, wherein said reflective coating is selected from the group consisting of gold, silver, and a gold and silver mixture.

11. The pump arrangement as claimed in claim 10, wherein said reflective coating is surrounded by at least one thermally conductive coating.

* * * * *